United States Patent [19]

Kamada et al.

[11] Patent Number: 5,075,546

[45] Date of Patent: Dec. 24, 1991

[54] MAGNETIC FIELD MEASUREMENT APPARATUS

[75] Inventors: Osamu Kamada, Ikoma; Hisashi Minemoto, Kyoto; Kazurou Toda, Hirakata; Daisuke Ishiko, Hirakata; Satoshi Ishizuka, Hirakata; Akihiro Miura, Akashi, all of Japan

[73] Assignees: Matsushita Electric Industrial Co., Ltd.; Kansai Electric Power Co., Inc., both of Osaka, Japan

[21] Appl. No.: 611,397

[22] Filed: Nov. 6, 1990

Related U.S. Application Data

[63] Continuation of Ser. No. 361,889, Jun. 6, 1989, abandoned.

[30] Foreign Application Priority Data

Jun. 10, 1988 [JP] Japan .................................. 63-144263

[51] Int. Cl.[5] ............................................. G01D 5/34
[52] U.S. Cl. ................................... 250/231.1; 250/225
[58] Field of Search ................. 324/96, 244, 375, 378; 250/225, 231, 231.1

[56] References Cited

U.S. PATENT DOCUMENTS 3,590,374  6/1971  Redhill et al. ......................... 324/96
4,554,449 11/1985  Taniuchi et al. ...................... 250/227
4,581,579  4/1986  Nagatsuma et al. ................. 324/244
4,604,577  8/1986  Matsumura et al. ................. 324/244
4,728,178  3/1988  Gualtieri et al. ...................... 350/377
4,770,504  9/1988  Hansen et al. ........................ 350/355

FOREIGN PATENT DOCUMENTS 0086387  8/1983  European Pat. Off. .
0262016  3/1988  European Pat. Off. .

OTHER PUBLICATIONS

Patent Abstracts of Japan, vol. 12, No. 349, (C-529), Sep. 20, 1988.
IEEE Transactions of Magnetics, vol. MAG-23, No, 5, Part II of Two Parts, Sep. 1987, pp. 3479-3481.
IEEE Journal of Quantum Electronics, vol. QE-18, No. 10, Oct. 1982, pp. 1619-1623.

Primary Examiner—David C. Nelms
Attorney, Agent, or Firm—Panitch Schwarze Jacobs & Nadel

[57]  ABSTRACT

A magnetic field measurement apparatus with high sensitivity and high accuracy in which a Bi-substituted rare-earth iron garnet crystal with a high and no temperature dependent sensitivity constant grown by liquid phase epitaxy is used for a magneto-optic element.

4 Claims, 8 Drawing Sheets

MAGNETIC FIELD MEASUREMENT APPARATUS

This application is a continuation of Ser. No. 361,889, filed June 6, 1989, now abandoned.

BACKGROUND OF THE INVENTION

1. Field of the Invention

This invention relates to an apparatus for determining the intensity of magnetic fields, in which Faraday rotation is observed using a magneto-optic element.

2. Description of the Prior Art

In recent years, as an optical method for determining the intensity of magnetic fields, the use of the Faraday effect has been proposed by, for example, Kyuma et al., IEEE, QE-18, 1619 (1982).

Methods for measuring the magnetic field intensity around a conductor through which current flows to thereby detect the current are advantageous in that an excellent insulation can be attained because of the use of light as a medium, and electromagnetic induction noise immunity may also be attained, so that the said methods can be applied to the disposition of power transmission.

FIG. 1 shows the principle of the method of measuring a magnetic field using the Faraday effect, in which a magneto-optic element 1 is placed in a magnetic field H. The linearly polarized light by a polarizer 2 is passed through the magneto-optic element 1. The polarization plane of light is rotated by an angle proportional to the magnetic field intensity H due to the Faraday effect. The polarized light rotated by the Faraday effect passes through an analyzer 3 which has a direction of polarization different from that of the polarizer 2 by 45°, and the angle of rotation, $\theta$, is converted to the change in the optical power. Optical output power in this case is given by the following equation.

$$P_{out} = K(1 + \sin 2\theta) \qquad (1)$$

$$\theta = CHl$$

wherein Pout denotes the optical output power, K is a proportional constant, $\theta$ is the Faraday rotation angle (degrees), $l$ represents the length of the magneto-optic element 1 in the direction of the propagation of light, and C is the sensitivity constant in units of degrees/cm.Oe representing the sensitivity of the magneto-optic element.

Applications of magnetic field measurement apparatuses based on this principle have been proposed, such as that which detects zero-phase current to determine the occurrence of accidents by feeding signals from magnetic field measuring instruments arranged at multiple points to an arithmetic operation unit where the waveforms are added or subtracted to generate reference signals.

A typical magneto-optic element used in such a is magnetic field measurement apparatus is YIG crystal which is represented by the general formula $Y_3Fe_5O_{12}$. However, as shown in FIG. 2, the sensitivity constant C of YIG changes greatly with temperature, showing an increase as large as 16% over a temperature ranging from $-20°$ C. to 120° C. around the working temperature, resulting in the practical problem of great deviation in the measurement accuracy with the change of the ambient temperature. To eliminate this problem, a rare-earth iron garnet crystal, represented by the general formula $Tb_xY_{3-x}Fe_5O_{12}$ wherein x is limited to $0.3 \leq x \leq 0.9$, is used for a magneto-optic element. An apparatus which uses this magneto-optic element has a remarkably improved measuring-accuracy in which the variation with temperature is $\pm 1\%$ over a temperature ranging from $-25°$ C. to 120° C.

A rare-earth iron garnet crystal substituted with Bi has a large Faraday effect and, when used for a magneto-optic element, improves the sensitivity of the magnetic field measurement apparatus. At present, the Bi-substituted rare-earth iron garnet crystal having a temperature independent sensitivity constant and good characteristics in practical application, has not heretofore been available.

Because magneto-optic elements with a length of about 2 mm are required, rare-earth iron garnet crystals such as YIG which does not include Bi are made by the Flux method or the FZ method, which makes the manufacturing period long, causing a disadvantage in mass production of the measurement apparatus. Moreover, a magnetic field measurement apparatus utilizing as a magneto-optical element such rare-earth iron garnet crystals which do not include Bi must be provided with an expensive light source and photo-detector designed for the 1.3 μm band, which makes the magnetic field measurement apparatus expensive.

SUMMARY OF THE INVENTION

The magnetic field measurement apparatus of this invention, which overcomes the above-discussed and numerous other disadvantages and deficiencies of the prior art, comprises:

a magneto-optic transducer that has a polarizer, an analyzer, and a magneto-optic element made of Bi-substituted rare-earth iron garnet crystal which is represented by the general formula $Bi_xGd_yY_{3-(x+y)}Fe_5O_{12}$ ($1.0 > x \leq 1.4$; $0.1 \leq y \leq 0.7$) and placed between the polarizer and the analyzer which have polarization directions different from each other;

light transmission paths that are provided on both sides of the magneto-optic transducer;

a light generating means that supplies light to the light transmitting path;

a light detecting means that detects the optical output power generated by the incident light that has passed through the magneto-optic transducer so as to convert the optical output power into electric signals; and an electric circuit that processes the electric signals fed from the light detecting means, wherein the magneto-optic transducer in a magnetic field is placed into the magnetic field to be measured to thereby determine the intensity of the magnetic field.

In a preferred embodiment, the magnetic field measurement apparatus comprises a plurality of magneto-optic transducers in the same number as that of the magnetic fields to be measured, a plurality of light detecting means that convert the optical output power into electric signals in the same number as that of the magnetic fields to be measured, and a signal processing circuit that adds and subtracts the electric signals received from each of the detecting means, wherein the magneto-optic transducers are placed into the magnetic fields to be measured to thereby determine the intensity of each of the magnetic fields.

In a more preferred embodiment, the magneto-optic element is made of a crystal that is epitaxially grown on a Ca-Mg-Zr substituted $Gd_3Ga_5O_{12}$ or $Nd_3Ga_5O_{12}$ substrate.

In a preferred embodiment, the spectrum band of the light generating means has a peak at a wavelength in the range of 0.7 μm to 0.9 μm.

Thus, the invention described herein makes possible the objectives of (1) providing a magnetic field measurement apparatus with high sensitivity and high accuracy in which a Bi-substituted rare-earth iron garnet crystal with a high sensitivity constant that does not substantially vary depending upon temperatures is used for a magneto-optic element; and (2) providing a magnetic field measurement apparatus for which a magneto-optic element is formed by liquid phase epitaxy, and an inexpensive light source and photodetector for the 0.8 μm band are used, thereby attaining mass production of the said magnetic field measurement apparatus at low costs.

BRIEF DESCRIPTION OF THE DRAWINGS

This invention may be better understood and its numerous objects and advantages will become apparent to those skilled in the art by reference to the accompanying drawings as follows.

DETAILED DESCRIPTION OF THE INVENTION

Figure 1:
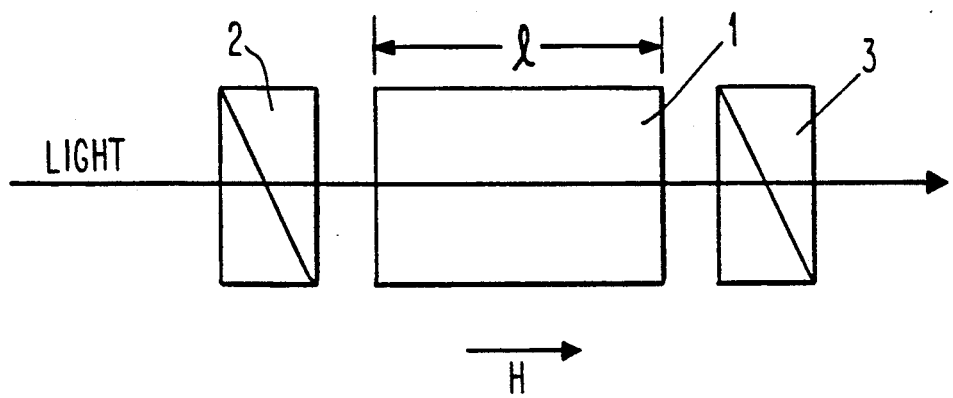
FIG. 1 is a schematic diagram showing the principle of the method of measuring the intensity of a magnetic field by the use of the Faraday effect.
Figure 2:
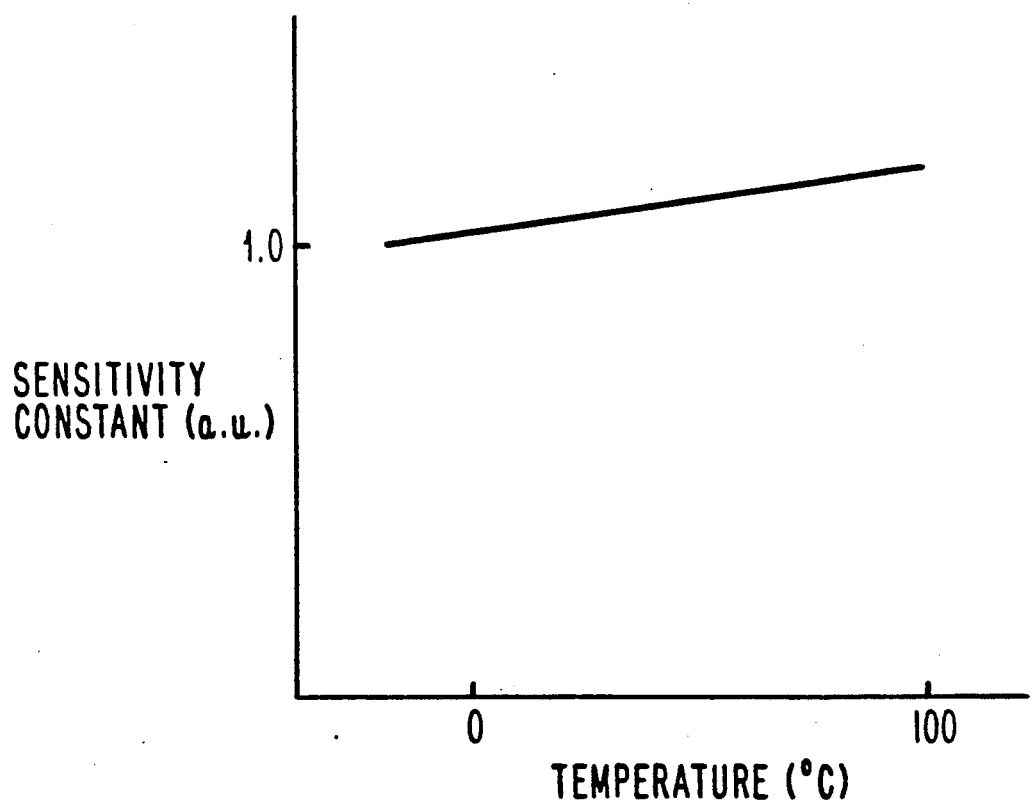
FIG. 2 is of a graph showing the variation of the sensitivity constant of YIG with temperature.
Figure 3:
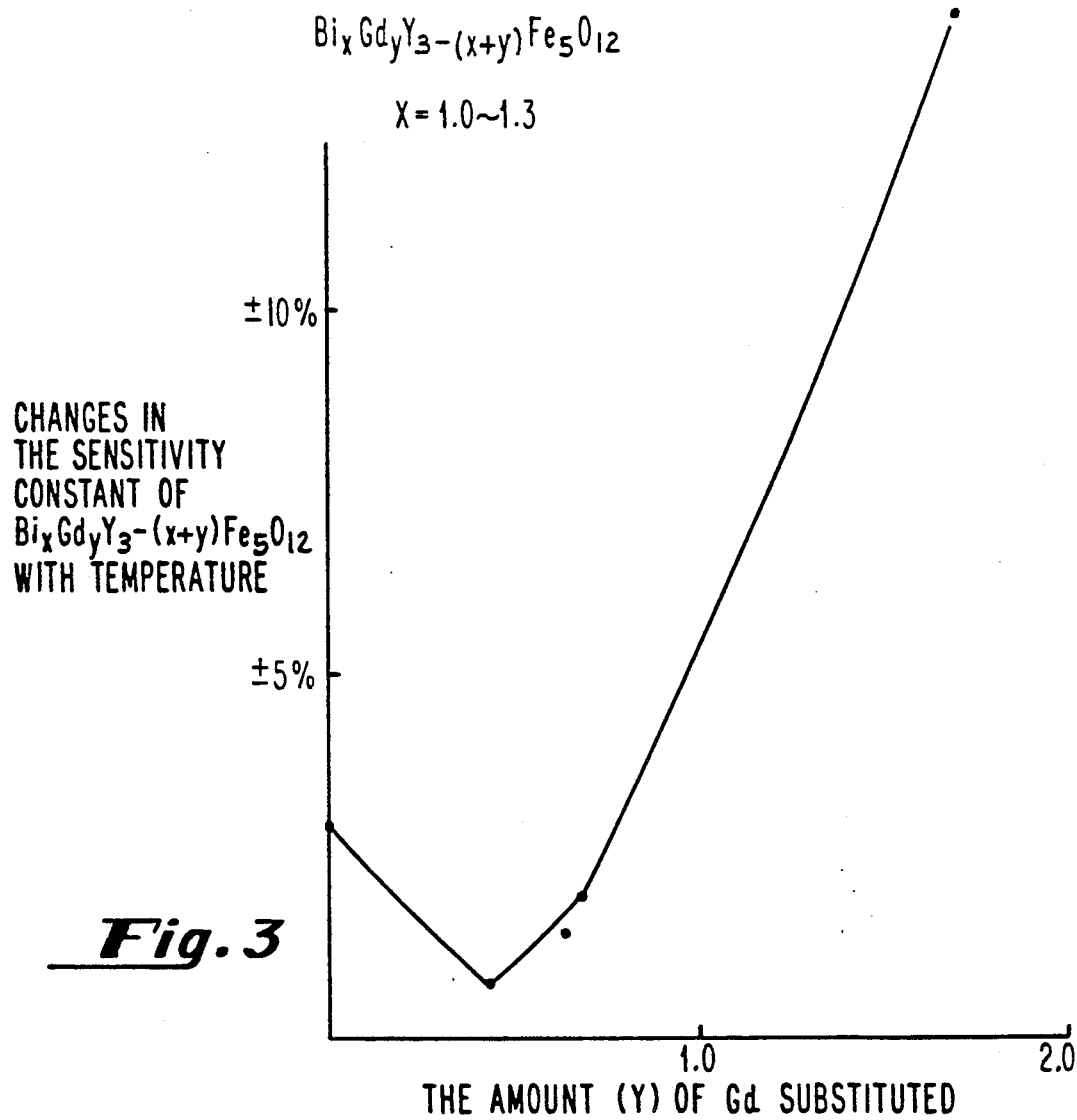
FIG. 3 is of a graph showing the dependence of the Gd concentration on the variation in the sensitivity constant of $Bi_xGd_yY_{3-(x+y)}Fe_5O_{12}$ with temperature.

The magneto-optic element used in this invention is formed by a material that is represented by the general formula $Bi_xGd_yY_{3-(x+y)}Fe_5O_{12}$. The deviation of the sensitivity constant of this crystal with temperature is shown in FIG. 3. When the value of y is in the range of 0.1 to 0.7 (i.e., $0.1 \leq y \leq 0.7$), the change is within ±1% over a temperature ranging from −20° C. to 80° C. When the magneto-optic element used in the present invention is formed by a material having the formula $Bi_{1.3}Gd_{0.43}Y_{1.27}Fe_5O_{12}$, it exhibits the the excellent characteristics with a temperature-dependence of as low as ±0.5%. The reasons therefor are as follows.

Figure 4:
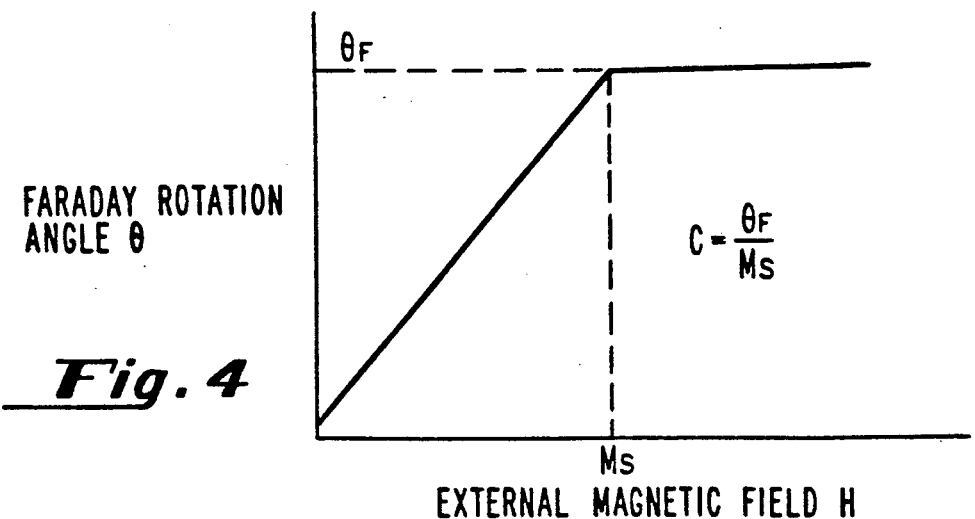
FIG. 4 is of a graph showing the Faraday effect of rare-earth iron garnet crystals.

Rare-earth iron garnet crystals are a ferrimagnetic material and the Faraday effect of which saturates at a specified magnetic field intensity as shown in FIG. 4.

For the measurement of the magnetic field, a part of the characteristic curve of FIG. 4 which shows linear change in response to an external magnetic field is used. In this case, the angle of Faraday rotation, $\theta$ caused by the external magnetic field is given as follows.

$$\theta = \theta_F (H/Ms) l \qquad (2)$$

where in $\theta_F$ denotes the specific Faraday rotation angle, Ms the saturation magnetization, and l the length of the crystal.

Accordingly, the sensitivity constant C and its temperature-dependence are defined as $$C(T) = \theta_F(T)/Ms(T) \qquad (3)$$

As can be seen from equation (3), the dependence of the sensitivity constant on temperature is determined by the changes of both $\theta_F$ and Ms with temperature. Differentiated with respect to temperature (T), both sides of equation (3) become $$\frac{1}{C} \cdot \frac{dC}{dT} = \frac{1}{\theta_F} \cdot \frac{d\theta_F}{dT} - \frac{1}{Ms} \cdot \frac{dMs}{dT} \qquad (4)$$

As can be seen from equation (4), the difference between the variation in the Faraday rotation angle with temperature (i.e., $$\frac{1}{\theta_F} \cdot \frac{d\theta_F}{dT} )$$

and the change in the saturation magnetization with temperature (i.e., $$\frac{1}{Ms} \cdot \frac{dMs}{dT} )$$

may be reduced to cause a decrease in the deviation of the sensitivity constant on the left side of equation (4) with temperature (i.e., $$\frac{1}{C} \cdot \frac{dC}{dT} ).$$

Figure 5:
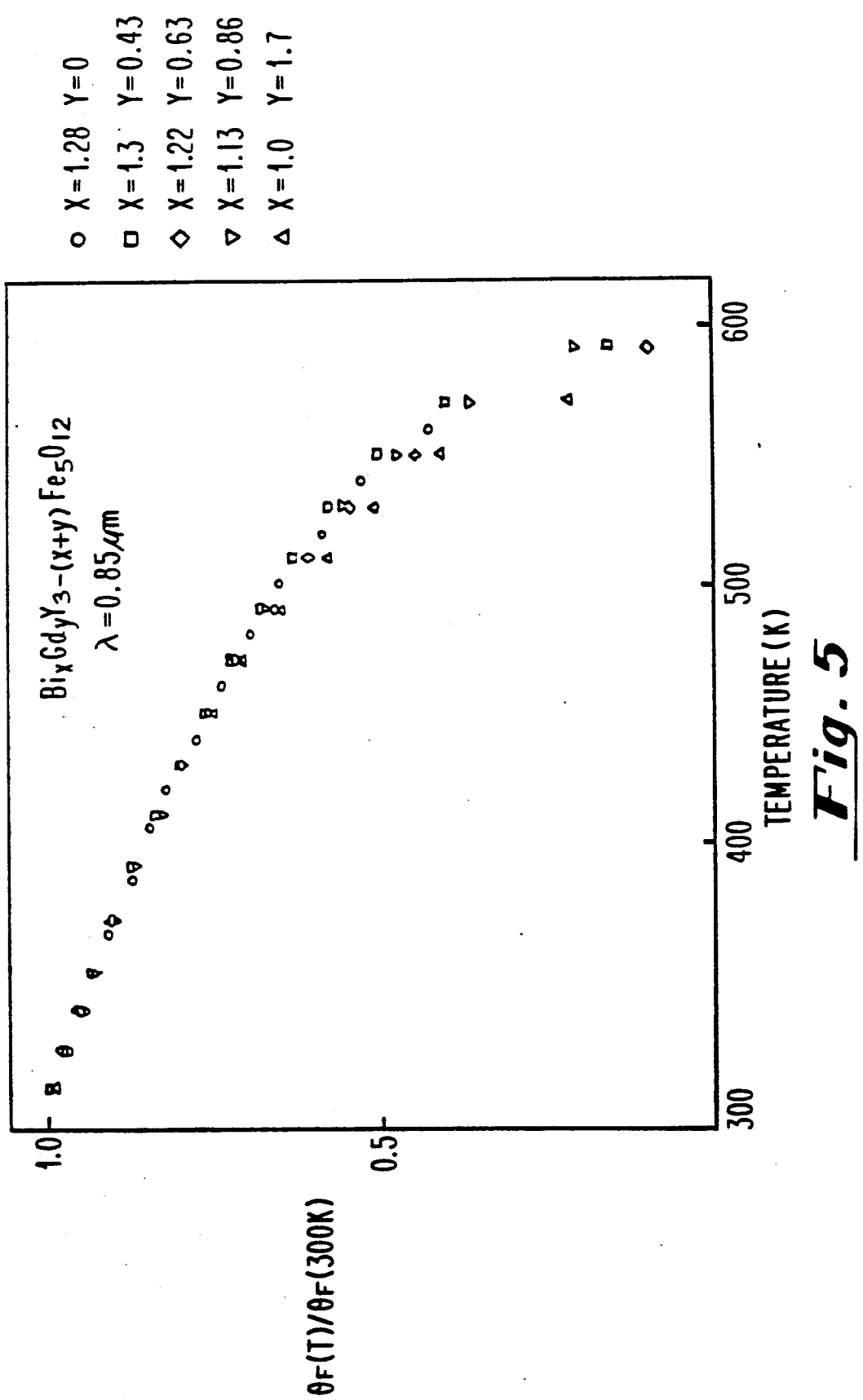
FIG. 5 is of a graph showing the variation in the Faraday rotation angle $\theta_F$ of $Bi_xGd_yY_{3-(x+y)}Fe_5O_{12}$.

FIG. 5 shows the change in $\theta_F$ of $Bi_xGd_yY_{3-(x+y)}Fe_5O_{12}$ with temperature. The measurements are normalized to $\theta_F$ at room temperature. The change of $\theta_F$ with temperature is independent of the amount y of Gd. This is because it is determined by x, the amount of substitution with Bi (x=1.0–1.3 in this case).

Figure 6:
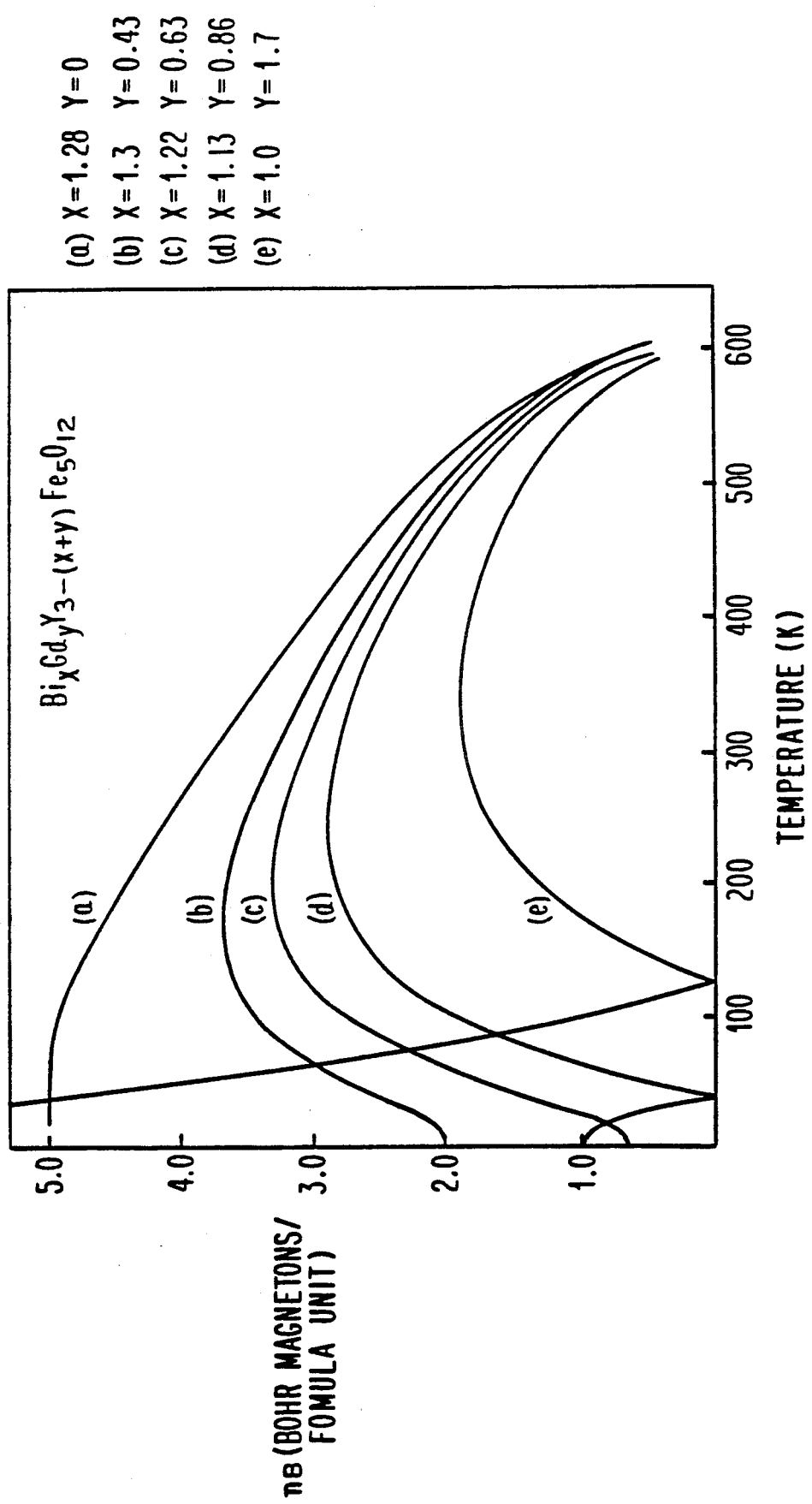
FIG. 6 is of a graph showing the change in the saturation magnetization Ms of $Bi_xGd_yY_{3-(x+y)}Fe_5O_{12}$ with temperature.

FIG. 6 shows the change in Ms of $Bi_xGd_yY_{3-(x+y)}Fe_5O_{12}$ with temperature. The change in Ms with temperature around room temperature is decreased with an increase in the quantity y of Gd. The magnitude of $$\frac{1}{Ms} \cdot \frac{dMs}{dT}$$

on the right side of Equation 4 can be varied by the addition of Gd and the magnitude of $$\frac{1}{C} \cdot \frac{dC}{dT}$$

can be decreased according to the amount of Gd added. As shown in FIG. 3, the change in the sensitivity constant of $Bi_xGd_yY_{3-(x+y)}Fe_5O_{12}$, wherein x is in the range of 1 to 1.3 and y is within the range of 0.1 to 0.7, (i.e., $1.0 \leq x \leq 1.3; 0.1 \leq y \leq 0.7$) with temperature, satisfies the relationship:

$$\frac{1}{C} \cdot \frac{dC}{dT} = \frac{1}{\theta F} \cdot \frac{d\theta F}{dT} - \frac{1}{Ms} \cdot \frac{dMs}{dT} \leq \pm 0.01\%/\text{deg}$$

Figure 7:
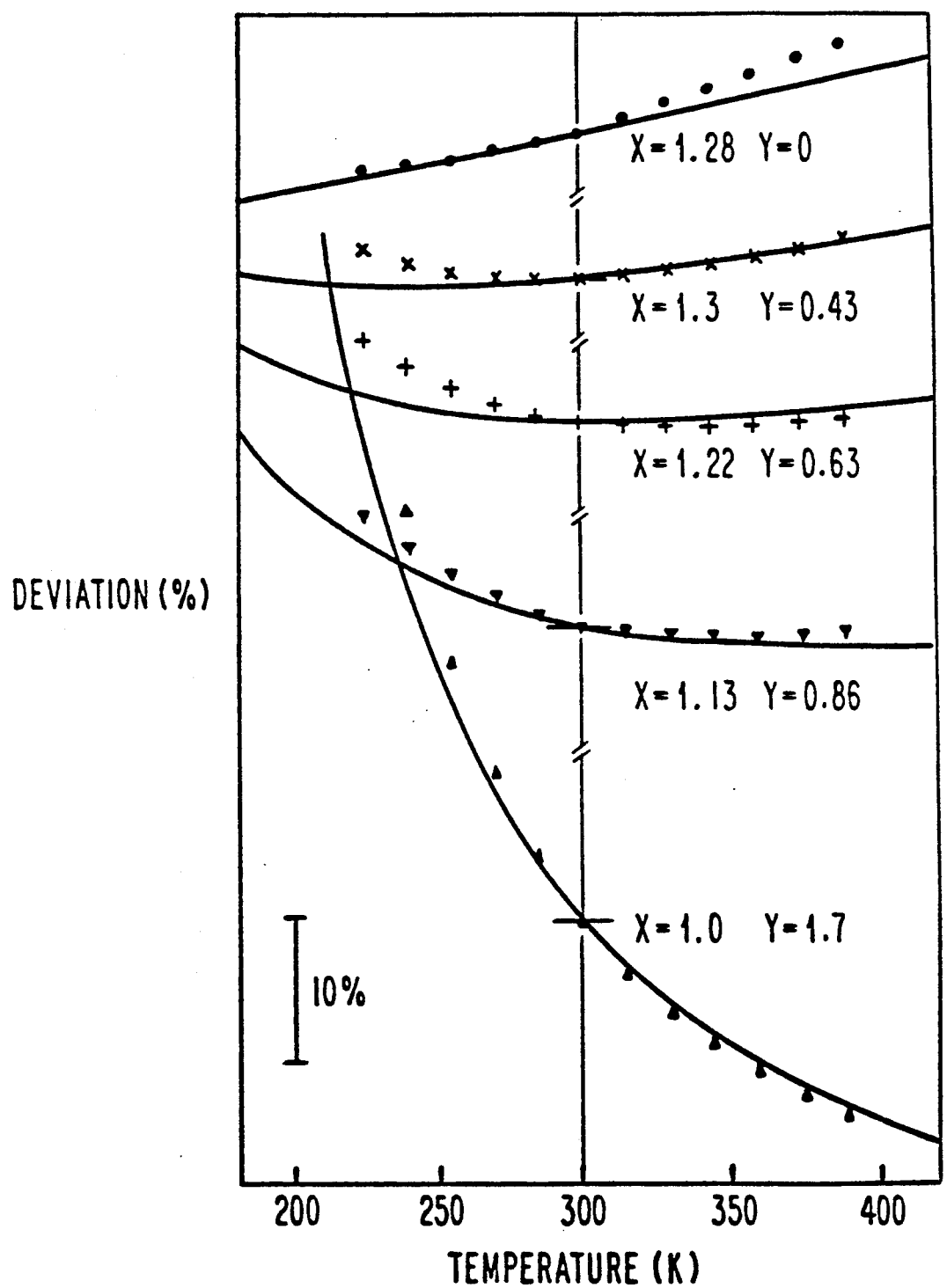
FIG. 7 is of a graph showing the change in the sensitivity constant of $Bi_xGd_yY_{3-(x+y)}Fe_5O_{12}$ with temperature.

As a result, the temperature-dependence of the sensitivity constant of materials belonging to the $Bi_xY_{3-y}Fe_5O_{12}$ group is improved by the addition of Gd. The result is shown in FIG. 7. As also shown in FIG. 3, $Bi_{1.3}Gd_{0.43}Y_{1.27}Fe_5O_{12}$ shows good temperature-dependence, i.e., within $\pm 0.5\%$. These crystals have been grown on a Ca-Mg-Zr substituted $Gd_3Ga_5O_{12}$ substrate by means of liquid phase epitaxy that has good performance in means production. It has a sensitivity constant C that is 1.4°/cm·Oe ($\lambda = 1.3$ μm) or 5.0°/cm·Oe ($\lambda = 0.85$ μm), both of which are greater than that of a conventional YIG crystal. The sensitivity thereof is further improved by using a light source with shorter wavelengths, such as $\lambda = 0.85$ μm. Consequently, a magnetic field measurement apparatus that has high sensitivity, high temperature stability and good mass-production performance can be manufactured by using the magneto-optic element.

DESCRIPTION OF THE PREFERRED EMBODIMENTS

EXAMPLE 1

Figure 8:
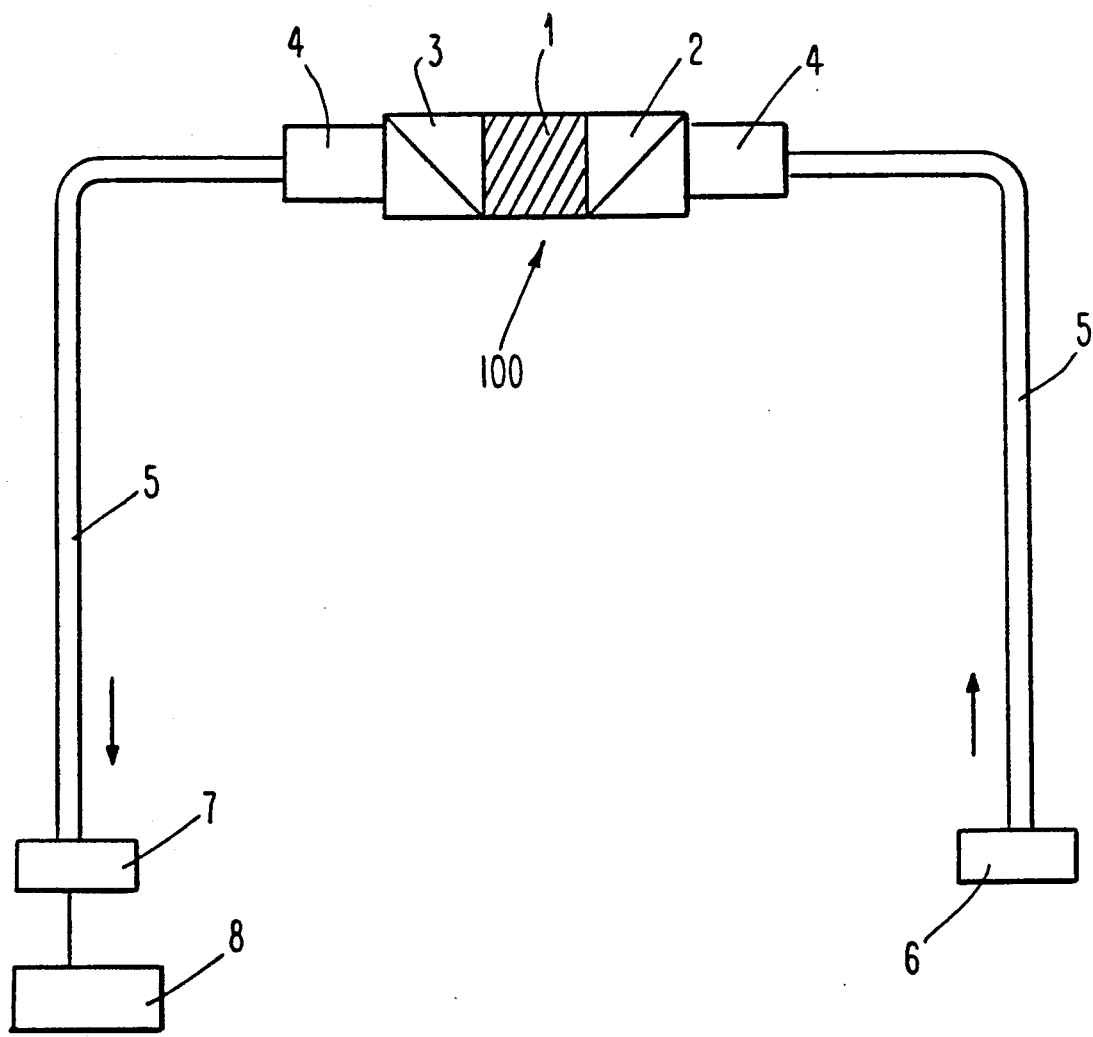
FIG. 8 is a schematic diagram showing a magnetic field measurement apparatus of this invention which incorporates a magneto-optic transducer.

FIG. 8 shows a magnetic field measurement of this invention, which comprises a magneto-optic transducer 100 that has a polarizer 2, an analyzer 3, and a magneto-optic element 1 made of Bi-substituted rare-earth iron garnet crystal which is represented by a general formula $Bi_xGd_yY_{3-(x+y)}Fe_5O_{12}$ ($1.0 \leq x \leq 1.4$; $0.1 \leq y \leq 0.7$) and placed between the polarizer and the analyzer which have polarization directions different from each other;

light transmission paths 5 that are provided on both sides of the magneto-optic transducer 100;

a light generating means 6 that supplies light to the light transmission path 5;

a light detecting means 7 that detects the optical output power generated by the incident light that has passed through the magneto-optic transducer 100 so as to convert the optical output power into electric signals; and an electric circuit 8 that processes the electric signals fed from the light detecting means 7, wherein the magneto-optic transducer 100 in a magnetic field is placed into the magnetic field to be measured to thereby determine the intensity of the magnetic field. The magneto-optic element 1 is made by the epitaxial growth of $Bi_{1.3}Gd_{0.43}Y_{1.27}Fe_5O_{12}$ which is 90 μm thick on a Ca-Mg-Zr substituted $Gd_3Ga_5O_{12}$ substrate. The polarizer 2 is provided on an end of the magneto-optic element 1. The analyzer 3 is provided on another end of the magneto-optic element 1 in such a configuration so the direction of polarization is inclined by 45° relative to the polarizer 2. For the polarizer 2 and the analyzer 3, a Glan-Thompson prism or a polarized beam splitter is used. A magneto-optic transducer 100, which comprises the magneto-optic element 1, the polarizer 2 and the analyzer 3, is placed in a magnetic field (H) to be measured. A lens 4 collimates the light incident upon the magneto-optic transducer 100 or the light passed through the magneto-optic transducer 100. The light transmission path 5 is formed by an optical fiber. The light generating means 6 is constituted by a light emitting diode or laser diode that generates light with a 0.8 μm or 1.3 μm wavelength band. A light emitting diode which has a spectrum band with a peak at a wavelength λ of 0.85 μm is used in this example. The detecting means 7 detects light which has passed through the element 1 and converts it to an electric signal. Although materials such as Ge-PD, Si-PIN-PD, etc., are usually used to make the detecting means 7. Si-PIN-PD is used in this example because a light emitting diode of 0.85 μm wavelength was used herein.

Figure 9:
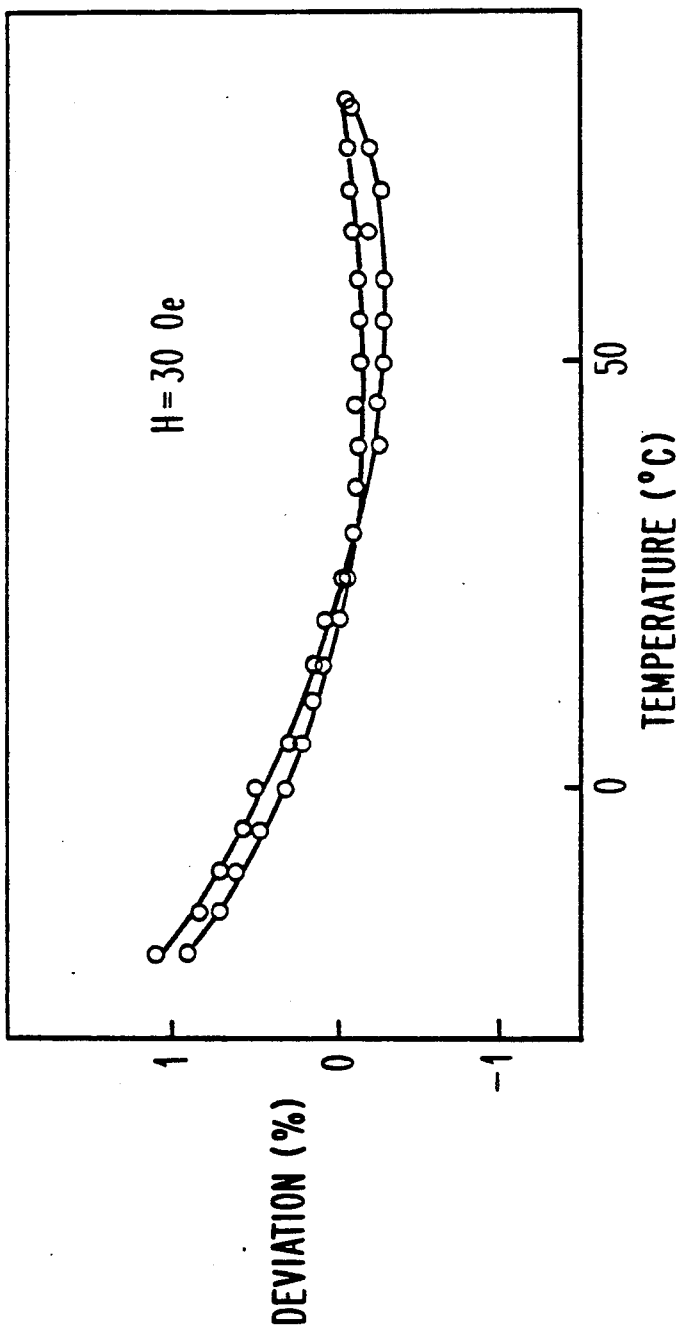
FIG. 9 is of a graph showing the dependence of the measuring accuracy of the magnetic field measurement apparatus of FIG. 8 on temperatures.

The intensity of a magnetic field, 150 Oe or less, was measured with such a magnetic field measurement apparatus, and measurement accuracy within $\pm 1\%$ was achieved over temperatures ranging from $-20$ to 80° C. FIG. 9 shows the ambient temperature-dependence of the measurement error for magnetic field of 30 Oe generated by a constant alternate current. The variation is limited to $\pm 0.5\%$ with the change of the ambient temperature from $-20°$ to 80° C.

EXAMPLE 2

Figure 10:
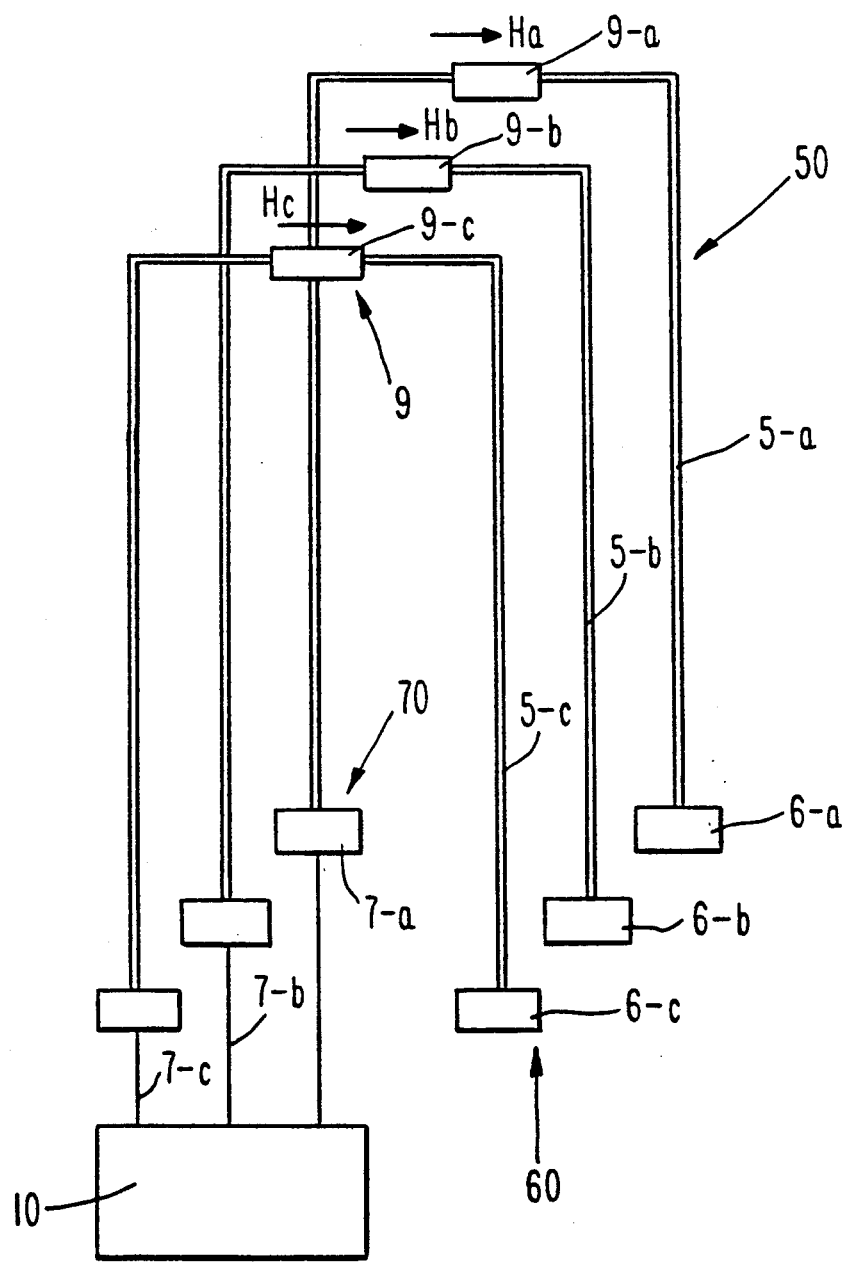
FIG. 10 is a schematic diagram showing another magnetic field measurement apparatus of this invention which incorporates three magneto-optic transducers and an electric circuit for arithmetic operation.

FIG. 10 shows another magnetic field measurement apparatus of this invention, which comprises a magneto-optic transducer 9 that is composed of three magneto-optic transducer elements 9-a, 9-b, and 9-c each of which is the same as the magneto-optic transducer 100 (FIG. 8) of Example 1, light transmission paths 50 that are composed of three pair of light transmission path elements 5-a, 5-b, and 5-c, each pair of which are the same as the light transmission paths 5 (FIG. 8) of Example 1, a light generating means 60 that is composed of three light generating means elements 6-a, 6-b, and 6-c, each of which is the same as the light generating means 6 (FIG. 8) of Example 1, and a light detecting means 70 that is composed of three light detecting means elements 7-a, 7-b, and 7-c, each of which is the same as the light detecting means 7 (FIG. 8) of Example 1. This magnetic field measurement apparatus further comprises an arithmetic operation processing circuit 10, for the processing of electric signals from the light detecting means 70, which is used herein instead of the electric circuit 8 (FIG. 8) of Example 1. By the use of this apparatus, the addition and subtraction of the measurements of the intensities of three different magnetic fields Ha, Hb and Hc were obtained with great accuracy.

As will be clear from the above description, the magnetic field measurement apparatus of this invention is capable of measuring a magnetic field intensity with high sensitivity and high accuracy independent of the changes in the ambient temperature, providing great advantages in industrial applications.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A magnetic field measurement apparatus comprising a magneto-optic transducer that has a polarizer, an analyzer, and a magneto-optic element made of a Bi-substituted rare-earth iron garnet crystal which is represented by the general formula $Bi_xGd_yY_{3-(x+y)}Fe_5O_{12}$ ($1.0 \leq x \leq 1.4$; $0.1 \leq y \leq 0.7$) and placed between the polarizer and the analyzer which have polarization directions different from each other, wherein the difference between the variation in the Faraday rotation angle of said crystal with temperature and the change in the saturation magnetization of said crystal with temperature is not more than $\pm 0.025\%$ /deg;

light transmission paths that are provided on both sides of the magneto-optic transducer;

a light generating means that supplies light to the light transmitting path;

a light detecting means that detects the optical output power generated by the incident light that has passed through the magneto-optic transducer so as to convert the optical output power into electric signals; and an electric circuit that processes the electric signals fed from the light detecting means, wherein the magneto-optic transducer in a magnetic field is placed into the magnetic field to be measured to thereby determine the intensity of the magnetic field.

2. A magnetic field measurement apparatus according to claim 1, which comprises a plurality of magneto-optic transducers in the same number as that of the magnetic fields to be measured, a plurality of light detecting means that convert the optical output power into electric signals in the same number as that of the magnetic fields to be measured, and a signal processing circuit that adds and subtracts the electric signals received from each of the detecting means, wherein the magneto-optic transducers are placed into the magnetic fields to be measured to thereby determine the intensity of each of the magnetic fields.

3. A magnetic field measurement apparatus according to claim 1, wherein said magneto-optic element is made of a crystal that is epitaxially grown on a Ca-Mg-Zr substituted $Gd_3Ga_5O_{12}$ or $Nd_3Ga_5O_{12}$ substrate.

4. A magnetic field measurement apparatus according to claim 1, wherein the spectrum band of said light generating means has a peak at a wavelength in the range of 0.7 μm to 0.9 μm.

* * * * *